US008103010B2

(12) United States Patent
Maruko et al.

(10) Patent No.: US 8,103,010 B2
(45) Date of Patent: Jan. 24, 2012

(54) ACOUSTIC SIGNAL PROCESSING APPARATUS AND ACOUSTIC SIGNAL PROCESSING METHOD

(75) Inventors: Tsuguto Maruko, Tokyo (JP); Naotaka Saito, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 918 days.

(21) Appl. No.: 12/123,751

(22) Filed: May 20, 2008

(65) Prior Publication Data

US 2009/0016543 A1 Jan. 15, 2009

(30) Foreign Application Priority Data

Jul. 12, 2007 (JP) ................................ 2007-183065

(51) Int. Cl.
*H03G 3/00* (2006.01)

(52) U.S. Cl. .............................. 381/61; 381/62; 381/98

(58) Field of Classification Search .............. 381/61–62, 381/98
See application file for complete search history.

(56) References Cited

U.S. PATENT DOCUMENTS

| | | | | |
|---|---|---|---|---|
| 3,127,476 | A * | 3/1964 | David, Jr. | 704/201 |
| 3,379,993 | A * | 4/1968 | Berman | 331/4 |
| 3,449,690 | A * | 6/1969 | Berman | 331/4 |
| 3,560,870 | A * | 2/1971 | Babany et al. | 331/4 |
| 3,564,446 | A * | 2/1971 | Babany | 331/40 |
| 3,569,838 | A * | 3/1971 | Blair et al. | 455/125 |
| 3,676,794 | A * | 7/1972 | Bidell et al. | 331/11 |
| 3,694,766 | A * | 9/1972 | Boelke | 331/11 |
| 5,867,794 | A * | 2/1999 | Hayes et al. | 455/557 |
| 6,067,511 | A * | 5/2000 | Grabb et al. | 704/223 |
| 6,078,880 | A * | 6/2000 | Zinser et al. | 704/208 |
| 6,081,776 | A * | 6/2000 | Grabb et al. | 704/219 |
| 6,094,629 | A * | 7/2000 | Grabb et al. | 704/219 |
| 6,098,036 | A * | 8/2000 | Zinser et al. | 704/219 |
| 6,119,082 | A * | 9/2000 | Zinser et al. | 704/223 |
| 6,138,092 | A * | 10/2000 | Zinser et al. | 704/223 |
| 6,408,079 | B1 * | 6/2002 | Katayama et al. | 381/98 |
| 7,003,120 | B1 * | 2/2006 | Smith et al. | 381/61 |
| 2008/0175409 | A1 * | 7/2008 | Lee et al. | 381/98 |
| 2009/0016543 | A1 * | 1/2009 | Maruko et al. | 381/61 |
| 2009/0132246 | A1 * | 5/2009 | Zinser et al. | 704/230 |
| 2010/0232624 | A1 * | 9/2010 | Zhang | 381/103 |

FOREIGN PATENT DOCUMENTS

| | | |
|---|---|---|
| JP | 2004-151225 | 5/2004 |
| JP | 2006-222670 | 8/2006 |
| JP | 2009021843 A * | 1/2009 |

* cited by examiner

*Primary Examiner* — Laura Menz
(74) *Attorney, Agent, or Firm* — Voletine & Whitt, PLLC

(57) ABSTRACT

An apparatus for performing processing of an input acoustic signal to be reproduced by a loudspeaker, which generates a harmonic of a low pitch sound component equal to or lower than a predetermined low cutoff frequency, and generates a harmonic synthesized acoustic signal synthesizing the input signal with the harmonic. The apparatus generates an output acoustic signal which cuts off, from the harmonic synthesized acoustic signal, a low pitch sound component equal to or lower than the low cutoff frequency and a high pitch sound component equal to or higher than the high cutoff frequency. The apparatus sets a low and high cutoff frequencies in accordance with an output characteristic of a loudspeaker.

7 Claims, 7 Drawing Sheets

FIG.2

| TYPE OF LOUD-SPEAKER | LOW CUTOFF FREQUENCY | HIGH CUTOFF FREQUENCY | HARMONIC CHARAC-TERISTIC ORDER | HARMONIC CHARAC-TERISTIC LEVEL | MAX. OUTPUT |
|---|---|---|---|---|---|
| LOUD-SPEAKER A | 200Hz | 15000Hz | 2 | 3 | 20dB |
| | | | 3 | 1 | |
| LOUD-SPEAKER B | 450Hz | 18000Hz | 2 | 5 | 10dB |
| | | | 3 | 2 | |
| | | | 4 | 1 | |
| LOUD-SPEAKER C | 150Hz | 15000Hz | 2 | 3 | 10dB |
| | | | 3 | 1 | |
| . . . | . . . | . . . | . . . | . . . | . . . |

ACOUSTIC SIGNAL PROCESSING APPARATUS AND ACOUSTIC SIGNAL PROCESSING METHOD

BACKGROUND OF THE INVENTION

1. Field of the Invention

The present invention relates to an acoustic signal processing apparatus and an acoustic signal processing method for signal processing of an input acoustic signal to be reproduced by a loudspeaker.

2. Description of the Related Art

Down-sizing demands are on the increase in cellular phones and the like, and loudspeakers built in the devices are demanded to be down-sized. However, there is a problem that low pitched or low frequency sound is not sufficiently reproduced. To solve such a problem, in the small-sized loudspeakers, low-sound reproduction is performed by using a harmonic in place of low pitch sound which is difficult to be sufficiently reproduced. It is known as the missing fundamental phenomenon in which one hears a sound like a sound which includes a sound of a frequency even if the sound of the frequency is not included, when a sound including a harmonic of the frequency (a sound of integral multiple of a frequency) is heard. Therefore, by reproducing a low pitch sound harmonic in place of a low pitch sound, a low pitch sound which is not really reproduced is heard as if the low pitch sound is reproduced.

Patent document 1 (Japanese Patent Application Publication Kokai No. 2006-222670 discloses an apparatus which controls the directivity of sound reproduced by a loudspeaker, by using a low pitch sound harmonic in place of a low pitch sound which is difficult to control its directivity. In this apparatus, a fundamental frequency is detected, by submitting to fast Fourier transform, an acoustic signal reproduced by a loudspeaker. Then, the harmonic of the detected fundamental frequency is emphasized and reproduced by the loudspeaker.

Also, Patent document 2 (Japanese Patent Application Publication Kokai No. 2004-151225) discloses an apparatus which permits to make easily perceive a low pitch sound by adding to an acoustic signal an odd-numbered harmonic of the acoustic signal reproduced by a loudspeaker. In this apparatus, by submitting an acoustic signal reproduced by a loudspeaker to fast Fourier transform processing and modulation processing, an odd-numbered harmonic of the acoustic signal is generated. Then, the generated odd-numbered harmonic component is added to the acoustic signal and reproduced by the loudspeaker.

In the apparatus described above in the Patent Document 1, by using a harmonic in place of a low pitch sound of which directivity is difficult to be controlled, directivity of a sound reproduced by a loudspeaker is controlled. This apparatus is used for controlling the directivity of sound reproduced by a large-sized loudspeaker, and not applied to a small-sized loudspeaker which cannot reproduce low pitch sound sufficiently. Moreover, in the apparatus described in the Patent Document 2, by submitting an acoustic signal to fast Fourier transform processing, an odd-numbered harmonic is generated. Then, by adding the generated odd-numbered harmonic to the acoustic signal, it is possible to make easily perceive a low pitch sound. However, in this apparatus, it is impossible to increase the volume of a sound reproduced by a loudspeaker without increasing output electric power. Moreover, the apparatuses described in Patent Documents 1 and 2, are forced to have an enormous amount of processing, due to fast Fourier transform processing utilized.

SUMMARY OF THE INVENTION

In view of the foregoing, it is an object of the present invention to provide an apparatus and method for processing an acoustic signal, which permit to increase a sound volume without increasing an output voltage even in a small-sized loudspeaker.

An acoustic sound processing apparatus according to the present invention is an acoustic signal processing apparatus for signal processing of an input acoustic signal to be reproduced by a loudspeaker, comprising a harmonic generator which generates a harmonic of a low pitch sound component included in said input acoustic signal, the low pitch sound component being equal to or less than a predetermined low cutoff frequency; a synthesis unit which synthesizes an input acoustic signal with a harmonic to generate a harmonic synthesized acoustic signal, a filter which cuts off, from said harmonic synthesized acoustic signal, a low pitch sound component equal to or lower than a low cutoff frequency and a high pitch sound component equal to or higher than a high cutoff frequency to generate an output acoustic signal, and a cutoff frequency setting unit for setting a low cutoff frequency and a high cutoff frequency, according to an output characteristic of a loudspeaker.

An acoustic signal processing method according to the present invention is an acoustic signal processing method, comprising a harmonic generating step of generating a harmonic of a low pitch sound component included in said input acoustic signal, the low pitch sound component being equal to or less than a predetermined low cutoff frequency; a synthesis step of generating a harmonic synthesized signal which synthesizes an input acoustic signal with a harmonic, a filtering step of generating an output acoustic signal which cuts off, from a harmonic synthesized acoustic signal, a low pitch sound component equal to or lower than a low cutoff signal, and a high pitch sound component equal to or higher than a predetermined high cutoff frequency, and a cutoff frequency setting step of setting a low cutoff frequency and a high cutoff frequency according to a loudspeaker output characteristic.

BRIEF DESCRIPTION OF THE DRAWINGS

FIG. 2 is a diagram showing a setting map of the acoustic signal processing apparatus in FIG. 1.

DETAILED DESCRIPTION OF THE INVENTION

Embodiments of the present invention will be described in detail with reference to the accompanying drawings.

Figure 1:
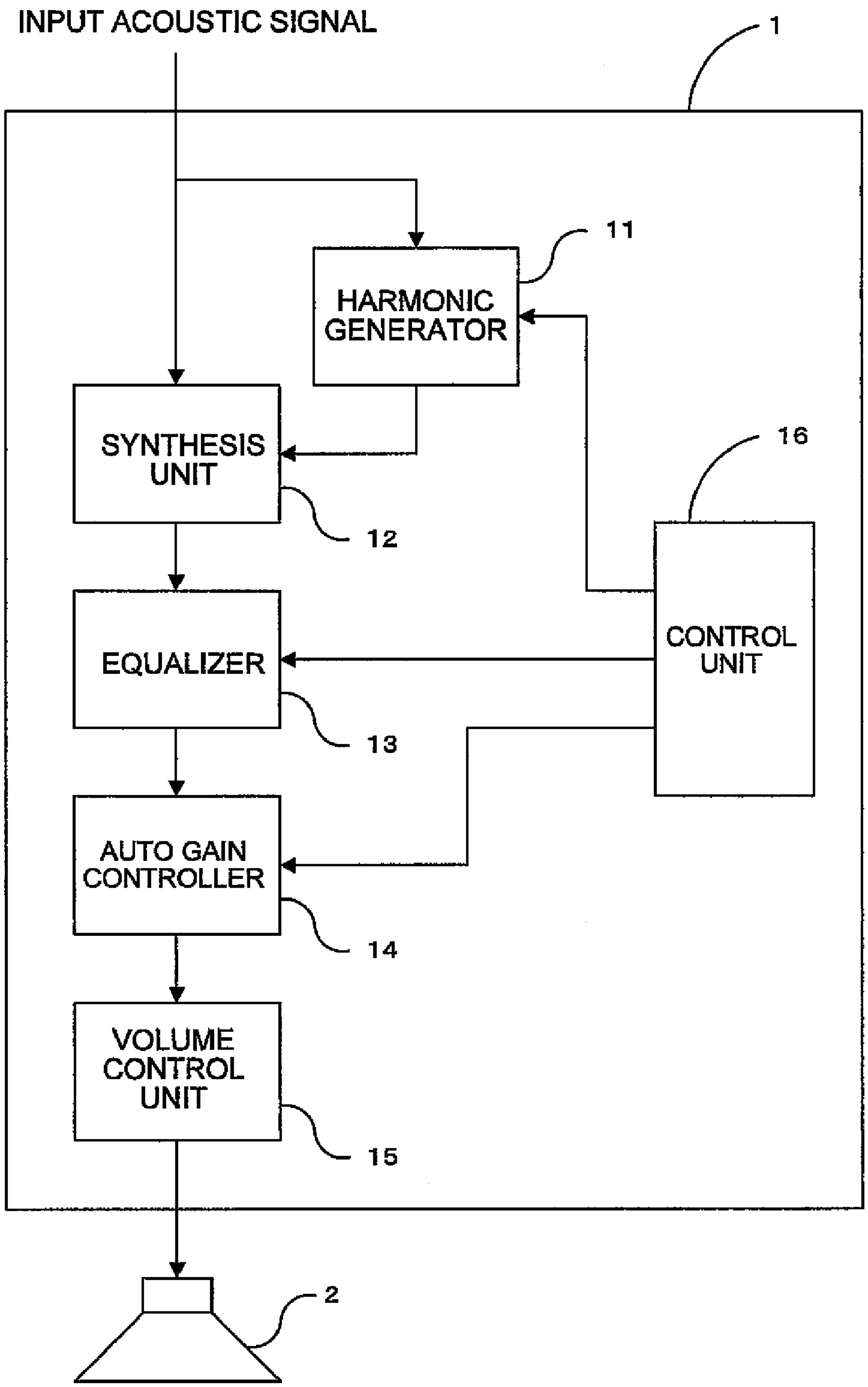
FIG. 1 is a block diagram showing an acoustic signal processing apparatus according to an embodiment of the present invention.

FIG. 1 shows an acoustic signal processing apparatus according to an embodiment of the present invention. An acoustic signal processing unit 1 processes an input acoustic signal to be reproduced by a loudspeaker 2. The input acoustic signal submitted to signal processing by the acoustic signal processing unit 1 is inputted to the loudspeaker 2 and reproduced thereby. The loudspeaker 2, for example, is a loudspeaker mounted in a cellular phone and the like, and can be various types of loudspeakers such as dynamic type, capacitor type and piezoelectric type.

The input acoustic signal inputted to the acoustic signal processing apparatus 1 is input to a harmonic generator 11 and a synthesis unit 12. The harmonic generator 11 generates a harmonic or harmonic overtones of a low pitch sound component equal to or lower than a predetermined low cutoff frequency included in the input acoustic signal. The value of the low cutoff frequency is set in accordance with an output characteristic of the loudspeaker 2. Among the methods for generating a low pitch sound component harmonic, one method and the like can be used to extract by a low pass filter, from an input acoustic signal, a low pitch sound component equal to or lower than a low cutoff frequency, and submit it to full-wave rectification. The characteristic of a harmonic to be generated (an order of a harmonic and level for each order) is set in accordance with an output characteristic of the loudspeaker 2. The synthesis unit 12 generates a harmonic synthesized acoustic signal which is generated by synthesizing an input acoustic signal with a harmonic generated by the harmonic generator 11.

An equalizer 13 generates an output acoustic signal which cuts off (including a meaning "attenuates"), from a harmonic synthesized acoustic signal, a low pitch sound component equal to and lower than a low cutoff frequency and a high pitch sound component equal to higher than a high cutoff frequency. A value for the low cutoff frequency and high cutoff frequency is set in accordance with the output characteristic of the loudspeaker 2. In this event, the equalizer 13 corresponds to a filter. An auto gain controller 14 amplifies an output acoustic signal with a predetermined gain. A gain of the auto gain controller 14 is set in accordance with an output characteristic of the loudspeaker 2. The gain of the auto gain controller 14 can be provided with a frequency-dependant characteristic which varies in accordance with a frequency of an output acoustic signal, or can have a constant value independent of a frequency of an output acoustic signal. Here, the auto gain controller 14 corresponds to an amplifying means. A volume control unit 15 changes an output acoustic signal amplified by the auto gain controller 14 to a predetermined sound volume to output to the loudspeaker 2.

Figure 3:
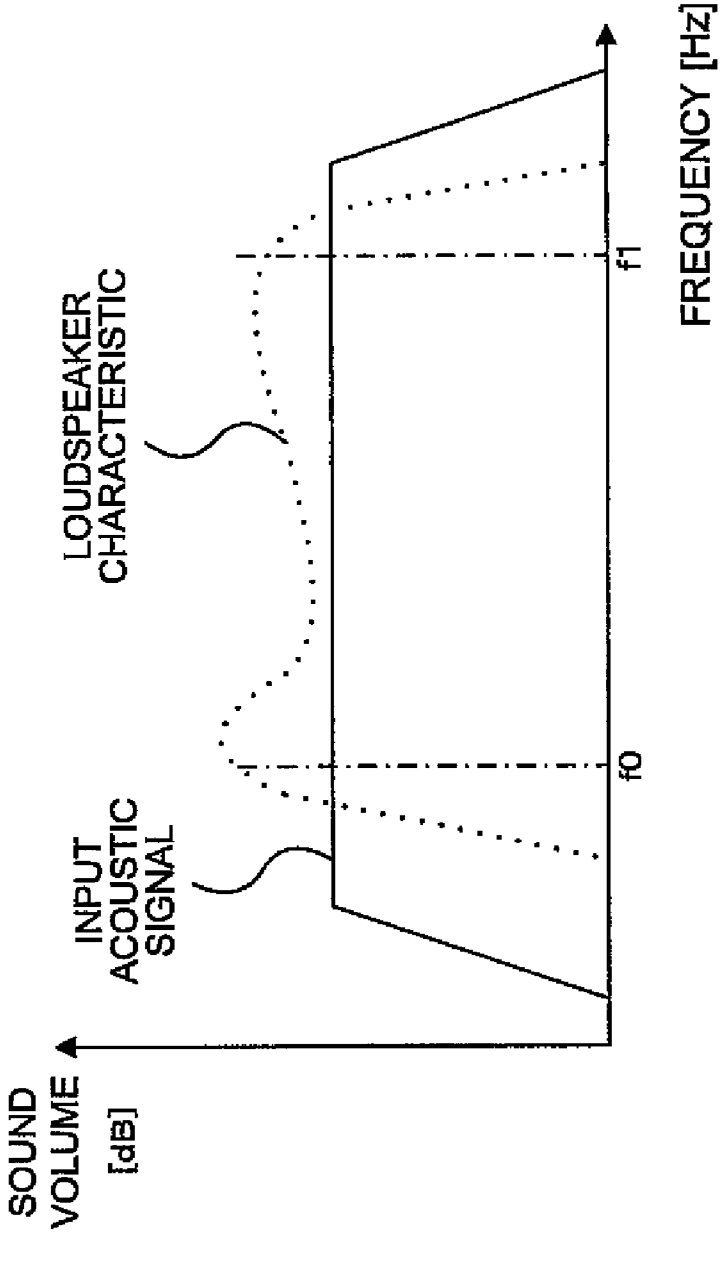
FIG. 3 is a diagram showing an output characteristic of loudspeakers connected to the acoustic signal processing apparatus in FIG. 1, and an example of input acoustic signals.

The control unit 16 performs control with respect to the harmonic generator 11, the equalizer 13 and the auto gain controller 14. The control unit 16, for example, sets a low cutoff frequency, a high cutoff frequency, a characteristic of a harmonic to be generated and a gain of the auto gain controller 14, according to a setting map shown in FIG. 2. The low cutoff frequency, high cutoff frequency, harmonic characteristic and the gain of the auto gain controller 14 are determined in accordance with an output characteristic of the loudspeaker 2. In the setting map shown in FIG. 2, a low cutoff frequency, high cutoff frequency, harmonic characteristic and a loudspeaker maximum output are described for each of the loudspeakers. Each of the values for the low cutoff frequency, the high cutoff frequency, the harmonic characteristic and the loudspeaker maximum output, described in the setting map in FIG. 2, is determined in accordance with the output characteristic of the loudspeakers. FIG. 3 shows a frequency included in an input acoustic signal and a frequency reproducible by the loudspeaker 2. The solid line indicates a frequency included in an input acoustic signal, and the dotted line indicates a frequency reproducible by the loudspeaker 2. As shown in FIG. 3, the range of frequencies reproducible by the loudspeaker 2 is a range narrower than that of the frequencies included in the input acoustic signal. The values of the low pitch sound cutoff frequencies described in the setting map in FIG. 2 are limited to lower limit frequencies in a range of frequencies which can be sufficiently reproduced by the loudspeaker 2, for example, to a value of f0 in FIG. 3. The high cutoff frequency is limited to a higher limit frequency in a range of frequencies which can be sufficiently reproduced by the loudspeaker 2, for example, to a value of f1 in FIG. 3. The order of a harmonic to be generated is determined so that the frequency of the harmonic to be generated is included in a range of frequencies which can be sufficiently reproduced by the loudspeaker 2, for example, in a frequency range between f0 and f1. The level for each order of a harmonic is determined so that the quality of sound to be reproduced by the loudspeaker becomes an adequate sound quality. The gain of the auto gain controller is set so that the sound volume of an output acoustic signal after amplification does not surpass the maximum output of the loudspeaker 2. The gain of the auto gain controller 14 can be set so that it varies in accordance with the frequency of an output acoustic signal. In this event, the control unit 16 corresponds to a cutoff frequency setting unit. In this event, the control unit 16 corresponds to a cutoff frequency setting unit. The setting map shown in FIG. 2 is stored in a memory (not shown) built in the acoustic signal processing unit 1.

Next, the operation of the acoustic signal processing unit 1 will be described. Here, an input acoustic signal inputted to the acoustic signal processing unit 1 is supposed to be indicated in a solid line in FIG. 3. Moreover, the frequency which can be reproduced by the loudspeaker 2 connected to the acoustic signal processing unit 1 is supposed to be indicated in a dotted line in FIG. 3. Moreover, such a setting map as shown in FIG. 2 is supposed to be set in advance in accordance with the output characteristic of the loudspeaker 2 connected to the acoustic signal processing unit 1.

Figure 4:
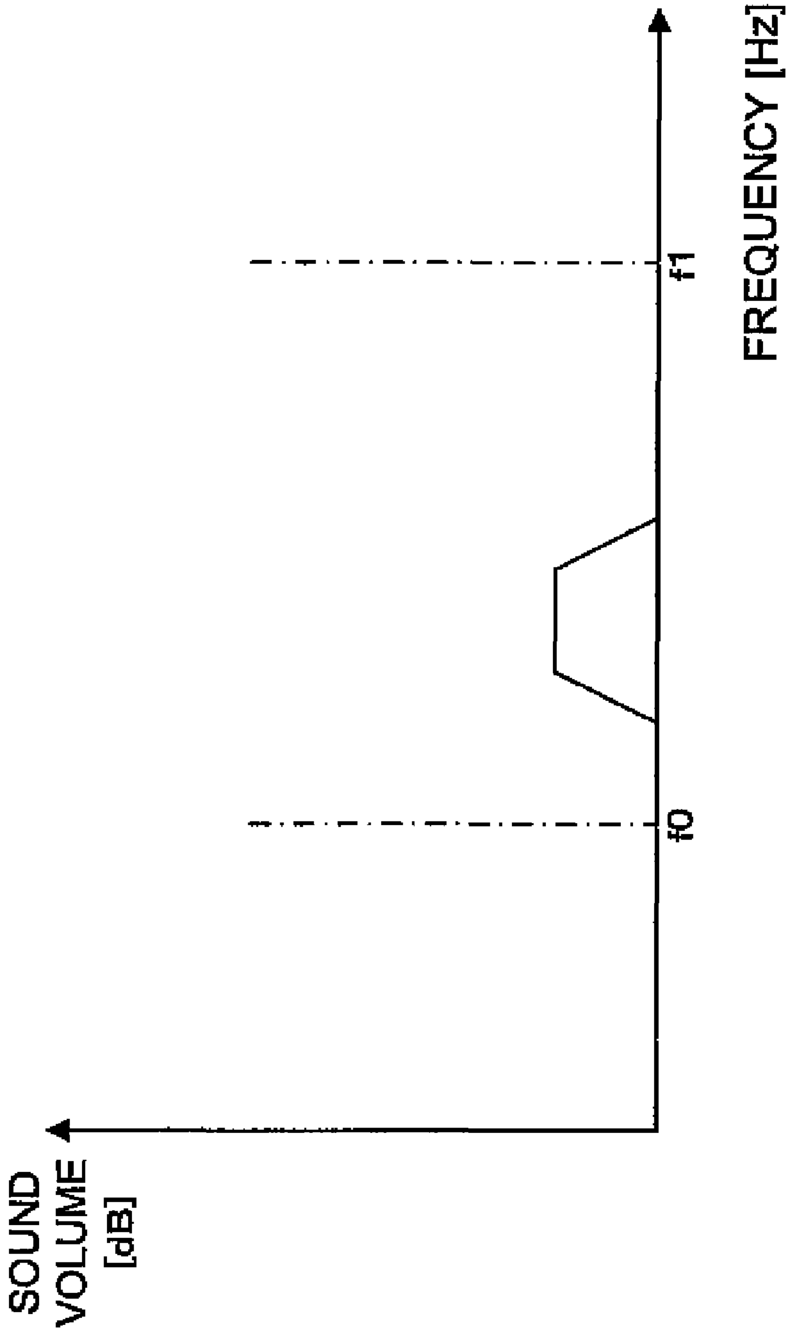
FIG. 4 is a diagram showing an example of a harmonic generated by the acoustic signal processing apparatus in FIG. 1.
Figure 5:
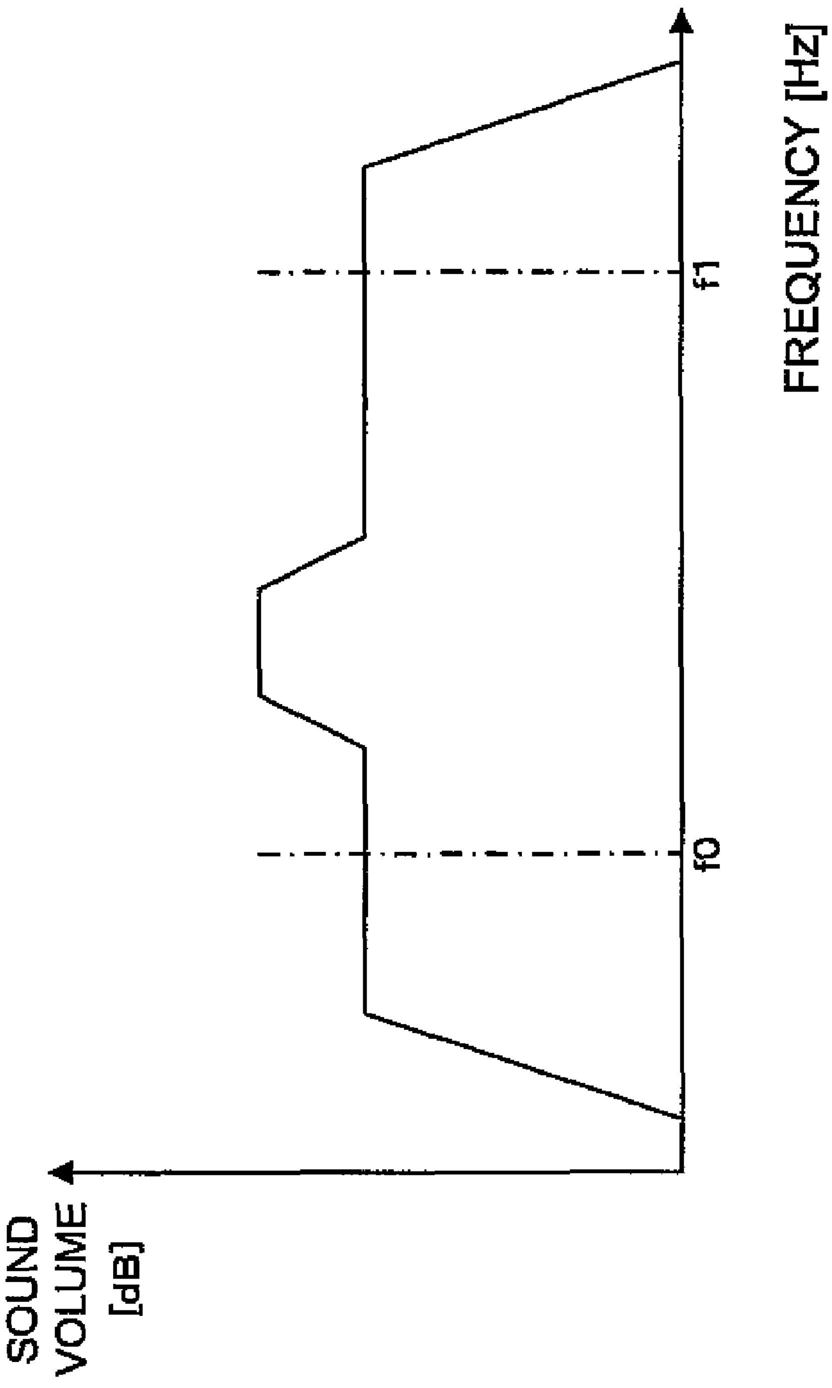
FIG. 5 is a diagram showing an example of a harmonic synthesized acoustic signal generated by the acoustic signal processing apparatus in FIG. 1.

An input acoustic signal is inputted to the harmonic generator 11 and the synthesis unit 12. The harmonic generator 11 generates a harmonic of a low pitch sound component equal to or lower than a predetermined low cutoff frequency included in the input acoustic signal. The low pitch sound cutoff frequency is set to a value in accordance with an output characteristic of the loudspeaker 2 according to the setting map shown in FIG. 2. Here, "200 Hz" in the row of "Loudspeaker A" in the setting map shown in FIG. 2, is supposed to be set as a low cutoff frequency. In this event, the low cutoff frequency 200 Hz corresponds to f0 in FIG. 3. Moreover, as an order of a harmonic to be generated, according to the setting map shown in FIG. 2, a value corresponding to the output characteristic of the loudspeaker 2 is set. Here, "2" and "3" in the row of "Loudspeaker A" in the setting map shown in FIG. 2 are set as an order of a harmonic. Further, as a level corresponding to the order "2" of the harmonic and a level corresponding to the order "3", "3" and "1" are set, respectively. In this event, as a harmonic, a sound having a frequency of twice the low pitch sound component and a sound having a frequency of three times the low pitch sound component are generated. Moreover, a harmonic is generated so that the level ratio of the sound having a frequency of twice the low pitch sound component to the sound having a frequency of three times the low pitch sound component harmonic becomes 3:1. The harmonic generator 11 generates, as a harmonic, two types of sound having frequencies of twice and three times the low pitch sound component equal to and lower than the low cutoff frequency f0 (200 Hz) which is included in an input harmonic signal. An example of a harmonic generated thereon is shown in FIG. 4. The generated harmonic is included in the range between f0 and f1, which is a range of frequencies sufficiently permitting to be reproduced by the loudspeaker 2. The synthesis unit 12 generates a harmonic synthesized acoustic signal by synthesizing an input acoustic signal with a harmonic generated by the harmonic generator 11. An example of a harmonic synthesized acoustic signal which synthesizes an input acoustic signal with a harmonic is shown in FIG. 5.

Figure 6:
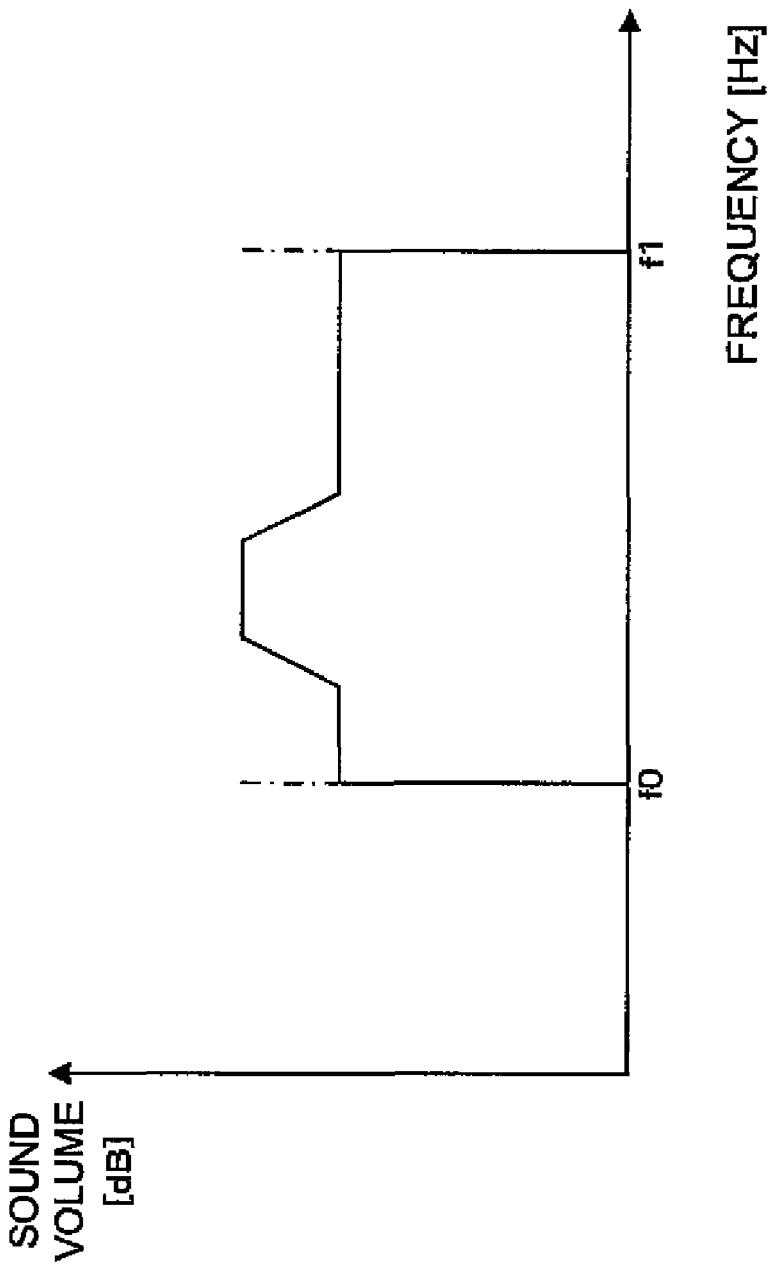
FIG. 6 is a diagram showing an example of an output acoustic signal generated by the acoustic signal processing apparatus in FIG. 1.

A harmonic synthesized acoustic signal synthesized by a synthesis unit 12 is inputted to an equalizer 13. Then, the equalizer 13 generates, from a harmonic synthesized acoustic signal, an output acoustic signal which cuts off a low pitch sound component equal to or lower than a low cutoff frequency, and a high pitch sound component equal to higher than a high cutoff frequency. The high cutoff frequency and low cutoff frequency are set to a value in accordance with an output characteristic of the loudspeaker 2 according to the setting map shown in FIG. 2. Here, "200 Hz" in the row of "Loudspeaker A" in the setting map shown in FIG. 2, is supposed to be set as a low cutoff frequency. Further, "15000 Hz" in the row of "Loudspeaker A" in the setting map shown in FIG. 2 is supposed to be set as a high cutoff frequency. In this event, "200 Hz" for the low cutoff frequency and "15000 Hz" for the high cutoff frequency correspond to f0 and f1, respectively in FIG. 3. The equalizer 13 generates, from a harmonic synthesized acoustic signal, an output acoustic signal after cutting off a low pitch sound component equal to or lower than a low cutoff frequency f0 (200 Hz) and a high pitch sound component f1 equal to or higher than a high cutoff frequency (15000 Hz). FIG. 6 shows an example of an output acoustic signal which cuts off, from a harmonic synthesized acoustic signal shown in FIG. 5, a low pitch sound component equal to or lower than a low cutoff frequency f0 (200 Hz) and a high pitch sound component equal to or higher than a high cutoff frequency f1 (15000 Hz). The output acoustic signal does not include a low pitch sound component equal to or lower than a low cutoff frequency f0 (200 Hz) and a high pitch sound component equal to or higher than a high cutoff frequency f1 (15000 Hz).

An output acoustic signal is inputted to the auto gain controller 14 and is amplified with a predetermined gain. The gain of the auto gain controller 14 is set to a value corresponding to an output characteristic of the loudspeaker 2 according to the setting map shown in FIG. 2. The gain of the auto gain controller 14 is set so that the sound volume of an output acoustic signal amplified by the auto gain controller 14 does not exceed the maximum output of the loudspeaker 2 shown in the setting map shown in FIG. 2. The output acoustic signal amplified by the auto gain controller 14 is changed to a sound volume set by the volume control unit 15, and then reproduced by the loudspeaker 2.

Thus, the acoustic signal processing unit 1 according to the embodiment of the present invention generates a harmonic of a low pitch sound component equal to or lower than a predetermined low cutoff frequency which is included in an input acoustic signal to be reproduced by the loudspeaker 2, and synthesizes the harmonic with an input acoustic signal, thereby generating a harmonic synthesized acoustic signal. Then, the equalizer 13 cuts off, from a harmonic synthesized acoustic signal, a low pitch sound component equal to or lower than a low cutoff frequency and a high pitch sound component equal to or lower than a high cutoff frequency, thereby generating an output acoustic signal. The low cutoff signal is set to a lower-limit frequency which can be sufficiently reproduced by the loudspeaker 2. The high cutoff frequency is set to a higher-limit frequency which can be sufficiently reproduced by the loudspeaker 2. The generated output acoustic signal is amplified with a predetermined gain by the auto gain controller 14, and then reproduced by the loudspeaker 2.

As the input acoustic signal is synthesized with the harmonic having a low pitch sound component equal to or less than the predetermined low cutoff frequency, even a small-sized loudspeaker which cannot sufficiently reproduce low pitch sounds enables a listener to hear low pitch sounds. When a low pitch sound component harmonic is reproduced, a low pitch sound can be heard by the human ear as if it seems to be reproduced.

Hence, even by a small-sized loudspeaker which cannot sufficiently reproduce a low pitch sound component, it is possible to reproduce the low pitch sound component by reproducing the low pitch sound component harmonic.

Furthermore, as from a harmonic synthesized acoustic sound which synthesizes an input acoustic signal with a low pitch sound component harmonic, a low pitch sound component equal to or lower than a low cutoff frequency and a high pitch sound component are cut off, an acoustic signal inputted to a loudspeaker accordingly does not include, in an acoustic signal to be input to a loudspeaker, a low pitch sound component nor a high pitch sound component which cannot be sufficiently reproduced by the loudspeaker. By cutting off, from an acoustic signal, a component of frequency range which cannot be reproduced by a loudspeaker, it is possible to reduce the amplitude of an acoustic signal, thereby enabling to decrease an electric power required for reproduction. Moreover, as the component of the frequency range which can be reproduced by a loudspeaker remains unchanged, the sound volume audible to the human ear does not vary. Hence, it is possible to decrease the electric power required for reproduction without changing the sound volume audible to the human ear.

Furthermore, as the auto gain controller 14 amplifies, with a predetermined gain, an output acoustic signal which cuts off, from a harmonic synthesized acoustic signal, a low pitch sound component equal to or lower than a low cutoff frequency and a high pitch sound component equal to or higher than a high cutoff frequency, it is possible to reproduce the output acoustic signal after increasing the amplitude of the output acoustic signal. Hence, it is possible to increase the volume of the sound to be reproduced by the loudspeaker 2.

As the low cutoff frequency, high cutoff frequency, harmonic characteristic and the gain of the auto gain controller 14 are set in accordance with the output characteristic of the loudspeaker 2 connected to the acoustic signal processing unit 1, it is possible to perform signal processing of an input acoustic signal in accordance with the output characteristic of the loudspeaker 2 to be connected.

Figure 7:
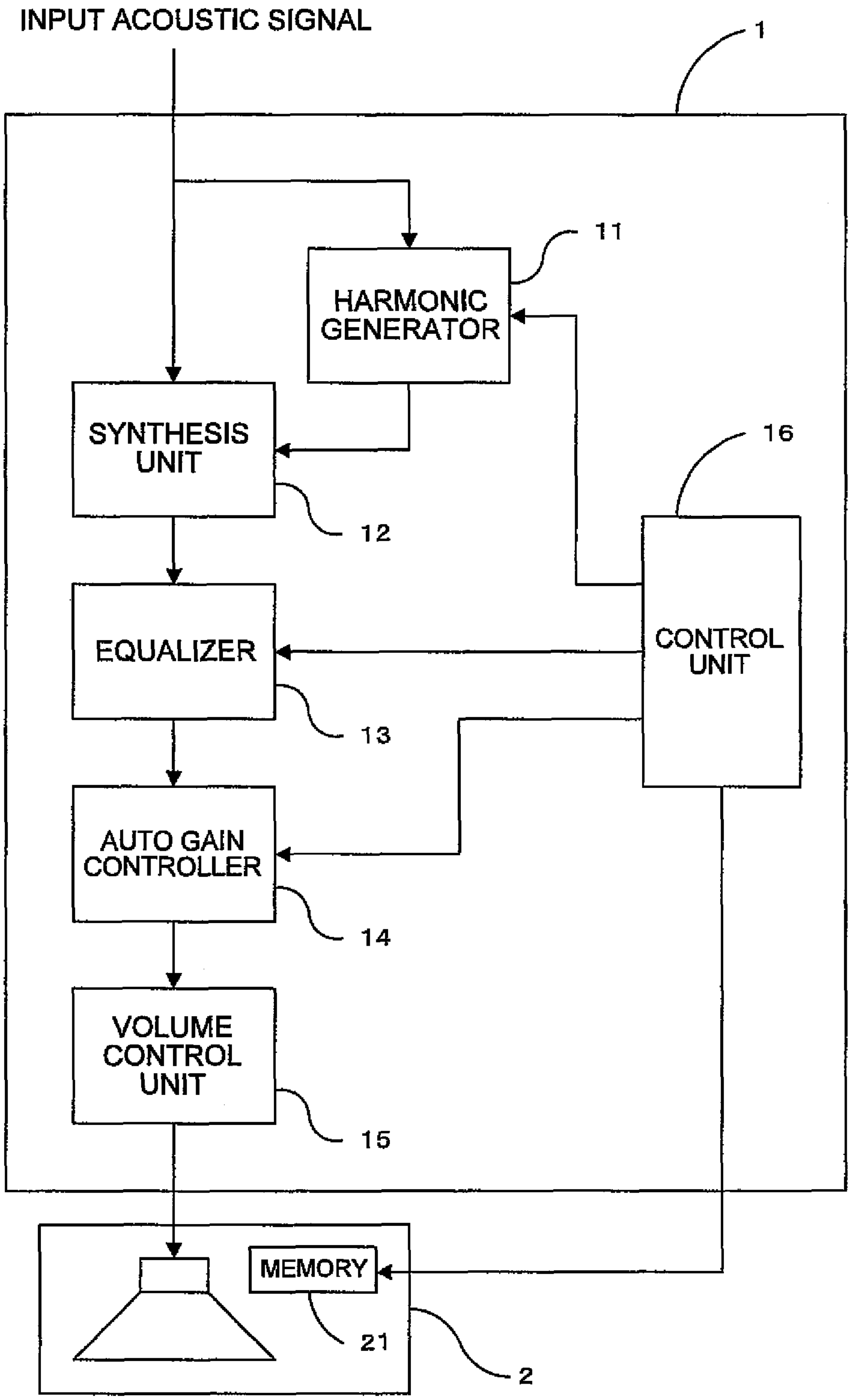
FIG. 7 is a block diagram showing a variation of the acoustic signal processing apparatus in FIG. 1.

In this event, when setting the low cutoff frequency, high cutoff frequency, harmonic characteristic and the gain of the auto gain controller 14 in accordance with the output characteristic of the loudspeaker 2, it may be set in such a manner that the output characteristic of the loudspeaker 2 is stored previously in a memory 21, which is fixed to a frame or the like of the loudspeaker 2, as shown in FIG. 7, a memory 21 and a control unit 16 are connected when connecting the acoustic signal processing unit 1 with the loudspeaker 2, and the control unit 16 reads out the output characteristic of the loudspeaker 2 from the memory 21. Stated another way, the acoustic signal processing unit may be separately provided from the loudspeaker 2, and the above-described settings can be carried out on the basis of an output characteristic of the loudspeaker 2 read from the memory 21 which is integrally provided with the loudspeaker 2.

As described above, according to the acoustic signal processing unit of the present invention, by synthesizing an input acoustic signal with a low pitch sound component harmonic, a low pitch sound component equal to or lower than a low cutoff frequency and a high pitch sound component equal to or higher than a high pitch sound component are cut off, thereby enabling to reproduce a low pitch sound component and to increase a volume of sound to be reproduced even by a small-sized loudspeaker which cannot sufficiently reproduce a low pitch sound.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2007-183065 which is hereby incorporated by reference.

What is claimed is:

1. An acoustic signal processing apparatus for performing signal processing of an input acoustic signal to be reproduced by a loudspeaker, comprising:

a harmonic generator which generates a harmonic of a low pitch sound component included in said input acoustic signal, the low pitch sound component being equal to or less than a predetermined low cutoff frequency;

a synthesis unit which synthesizes said input acoustic signal with said harmonic to generate a harmonic synthesized acoustic signal;

a filter which cuts off, from said harmonic synthesized acoustic signal, a low pitch sound component equal to or lower than a low cutoff frequency and a high pitch sound component equal to or higher than a high cutoff frequency to generate an output acoustic signal; and a cutoff frequency setting unit which sets said low cutoff frequency and said high cutoff frequency in accordance with an output characteristic of said loudspeaker.

2. An acoustic signal processing apparatus according to claim 1, wherein an order of said harmonic and a level for each order thereof are set in accordance with an output characteristic of said loudspeaker.

3. An acoustic signal processing apparatus according to claim 2, further comprising an amplifier for amplifying said output acoustic signal by a frequency dependent gain in accordance with said level and said output characteristic of said loudspeaker.

4. An acoustic signal processing apparatus according to claim 1, wherein said harmonic generator generates a plurality of harmonic overtones in accordance with the respective levels of the plurality of harmonic overtones.

5. An acoustic signal processing apparatus according to claim 1, wherein said acoustic signal processing unit is separately provided from said loudspeaker, said loudspeaker includes a memory integrally provided with the loudspeaker for storing the output characteristic of said loudspeaker, and said cutoff frequency setting unit reads the output characteristic of said loudspeaker from said memory to set said low cutoff frequency and said high cutoff frequency.

6. An acoustic signal processing apparatus according to claim 1, wherein said harmonic generator generates said harmonic in accordance with an output characteristic of the loudspeaker read from the memory.

7. An acoustic signal processing apparatus according to claim 1, wherein said amplifier amplifies said output acoustic signal in accordance with an output characteristic of the loudspeaker read from the memory.

* * * * *